(12) United States Patent
Chen

(10) Patent No.: US 6,611,417 B2
(45) Date of Patent: Aug. 26, 2003

(54) WAFER CHUCK SYSTEM

(75) Inventor: Fu-Sheng Chen, Hsinchu (TW)

(73) Assignee: Winbond Electronics Corporation (TW)

(*) Notice: Subject to any disclaimer, the term of this patent is extended or adjusted under 35 U.S.C. 154(b) by 240 days.

(21) Appl. No.: 09/814,067

(22) Filed: Mar. 22, 2001

(65) Prior Publication Data

US 2002/0135968 A1 Sep. 26, 2002

(51) Int. Cl.$^7$ .............................................. H02N 13/00
(52) U.S. Cl. ........................................................ 361/234
(58) Field of Search .............................. 361/234; 279/128

(56) References Cited

U.S. PATENT DOCUMENTS

| | | | | |
|---|---|---|---|---|
| 5,522,131 A | * | 6/1996 | Steger | 361/234 |
| 5,748,435 A | * | 5/1998 | Parkhe | 361/234 |
| 5,914,568 A | * | 6/1999 | Nonaka | 361/234 |
| 5,936,829 A | * | 8/1999 | Moslehi | 361/234 |

* cited by examiner

*Primary Examiner*—Ronald W. Leja
(74) *Attorney, Agent, or Firm*—Finnegan, Henderson, Farabow, Garrett & Dunner, L.L.P.

(57) ABSTRACT

A chuck system applicable to semiconductor fabrication processes for holding a workpiece that includes a pedestal that has an upper surface for supporting a semiconductor wafer, a plurality of gas holes and grooves. The gas holes pass through the pedestal and provide channels for gas to reach the semiconductor wafer. The grooves are formed on the upper surface of the pedestal and connect between the gas holes.

20 Claims, 2 Drawing Sheets

WAFER CHUCK SYSTEM

BACKGROUND OF THE INVENTION

1. Field of the Invention

This invention relates to a chuck system, and more particularly, to a chuck system applicable to a semiconductor fabrication process for holding a workpiece and controlling the processing temperature thereof.

2. Description of the Related Art

Chuck systems are used for holding a workpiece in various applications. In a semiconductor manufacturing process, a chuck system holds a semiconductor wafer in place during wafer processing operations. The manufacture of a semiconductor device usually involves hundreds of processing steps applied onto a semiconductor wafer to form electronic devices and circuits thereon. Various kinds of chuck systems are operated with various processes or processing chambers. During processing of a semiconductor wafer, a chuck system usually holds the wafer firmly in place to enhance the stability of the process. The chuck system also controls the temperature of the wafer during the process. Stability and temperature control of a chuck system promote uniformity during wafer processing for a given wafer as well as uniformity for the semiconductor manufacturing process in general.

An electrostatic chuck system generally holds a wafer on a platform by employing an electrostatic force, either by placing opposite charges on the wafer and the platform or by placing charges on either the wafer or the platform. Comparing with traditional chucking approaches, which are predominately mechanical chucks, an electrostatic chuck system avoids direct contact with the side of the semiconductor wafer that electronic components and devices are to be formed, i.e., device side. In sub-micron and deep sub-micron semiconductor processing, the feature size of devices on a wafer dives is extremely small and therefore control of processing parameters in each processing step becomes extremely important.

Taking a plasma processing chamber as an example, parameters such as chamber pressure, chamber temperature, and wafer temperature are vital. Typically, a plasma processing step involves the application of electromagnetic energy onto a wafer to proceed with high energy processes such as etching the wafer surface or depositing a new material onto the wafer. The plasma reaction, especially in a typical plasma etching process, increases the temperature on the wafer and therefore a cooling system is needed to maintain the surface temperature of the wafer within a prescribed range.

FIGS. 1a and 1b illustrate a conventional wafer cooling design of an electrostatic chuck system 12 in a plasma processing chamber 10. FIG. 1a illustrates the side view of the chuck system 12 that supports a wafer 14. FIG. 1b illustrates the top view of the chuck system 12 that has a plurality of gas holes 16 on the upper surface of the chuck system 12 that supports the wafer shown in FIG. 1a. The gas holes 16 vent gas during wafer processing operations to enhance thermal transfer between the wafer 14 and the chuck system 12. FIG. 1b also illustrates the use of four push pins, or lift pins, 18 in the electrostatic chuck system 12. FIG. 1c illustrates the cross-sectional view of the wafer 14 and the supporting surface 12a of the electrostatic chuck system 12. As illustrated in FIG. 1c, the contact area of the cooling gas holes 16 and the backside of the wafer 14 are limited to the opening area of the gas holes 16.

The limited area of cooling contacts leads to several problems during the plasma processing operations. Once the plasma processing chamber 10 is turned on to allow plasma bombardment of the wafer surface in an etching or deposition process, the surface temperature of the wafer 14 is raised significantly. However, the limited cooling contacts provided by the gas holes 16 dissipate heat efficiently only in the area around where the gas holes 16 are provided. The accumulation of energy on the wafer surface, especially in areas located far away from the gas holes, increases the wafer temperature and therefore may vary the processing characteristics. The local accumulation of energy also results in the non-uniformity of the temperature distribution across the entire wafer. The irregular temperature distribution may cause deformation of the wafer. Moreover, the irregular temperature distribution also varies the effectiveness of plasma bombardment on different areas of the wafer surface and induces other process defects that impacts the yield and uniformity of products. In order to avoid these problems, the power density of the operating plasma has to be reduced and such adjustments usually increase the processing time of each wafer and reduce the production efficiency of the plasma processing chamber 10.

SUMMARY OF THE INVENTION

Accordingly, the present invention is directed to a chuck system that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structures particularly pointed out in the written description and claims thereof, as well as the appended drawings.

To achieve these and other advantages, and in accordance with the purpose of the invention as embodied and broadly described, the present invention provides a chuck system that includes a pedestal having an upper surface for supporting a semiconductor wafer, a plurality of gas holes passing through the pedestal, the gas holes providing channels for gas to travel therethrough, and a plurality of grooves on the upper surface of the pedestal, the grooves connecting the gas holes.

In one aspect of the invention, the chuck system further includes a gas supplying device that pumps gas to the gas holes and grooves.

In another aspect of the invention, the gas holes include a first set of gas holes arranged in a circular pattern on the pedestal in a first radius and a second set of gas holes arranged in a circular pattern on the pedestal in a second radius, the second radius being greater than the first radius.

In yet another aspect of the invention, the chuck system also includes a center gas hole in the center of the pedestal and grooves connecting between the center gas hole and the first set of gas holes, the grooves being curved grooves on the upper surface of the pedestal.

In still another aspect of the invention, the grooves comprise a first set of circular grooves connecting the first set of gas holes and a second set of circular grooves connecting the second set of gas holes.

Also in accordance with the present invention, there is provided an electrostatic chuck system that includes a pedestal having an upper surface for supporting a semiconductor wafer, a plurality of gas holes passing through the pedestal, the gas holes providing channels for gas to reach the semiconductor wafer, and a plurality of grooves on the upper surface of the pedestal, the grooves including liner grooves and curved grooves connecting between the gas holes.

Further in accordance with the present invention, there is provided a chuck system that includes a pedestal having an upper surface for supporting a semiconductor wafer, a plurality of gas holes passing through the pedestal, the gas holes providing channels for gas to reach the semiconductor wafer. The gas holes include a center gas hole in the center of the pedestal, a first set of gas holes arranged in a circular pattern on the pedestal in a first radius, and a second set of gas holes arranged in a circular pattern on the pedestal in a second radius, the second radius being greater than the first radius. The chuck system also includes a plurality of grooves on the upper surface of the pedestal, wherein the grooves include center grooves connecting between the center gas hole and the first set of gas holes, the grooves being curved grooves on the upper surface of the pedestal, first circular grooves connecting between the first set of gas holes, second circular grooves connecting between the second set of gas holes, linear grooves connecting between the first set of gas holes and the second set of gas holes, and curved grooves connecting the second set of gas holes to the first circular grooves connecting between the first set of gas holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

The present invention provides a chuck system applicable to semiconductor fabrication processes for holding a workpiece and effectuating temperature control of the workpiece. The chuck system provides a plurality of grooves that connect among a plurality of gas holes. The chuck system of the present invention maintains uniform temperature distribution across the wafer during wafer processing operations. Therefore, a wafer processing step such as a plasma etching or deposition operation may proceed with raised energy and increased efficiency without the risk of reduced yield due to insufficient cooling or temperature control.

Figure 1A:
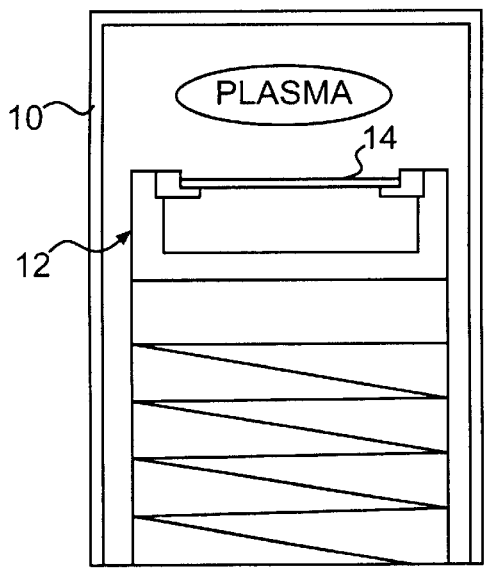
FIG. 1a illustrates a side view a conventional electrostatic chuck system with a wafer cooling design.
Figure 1B:
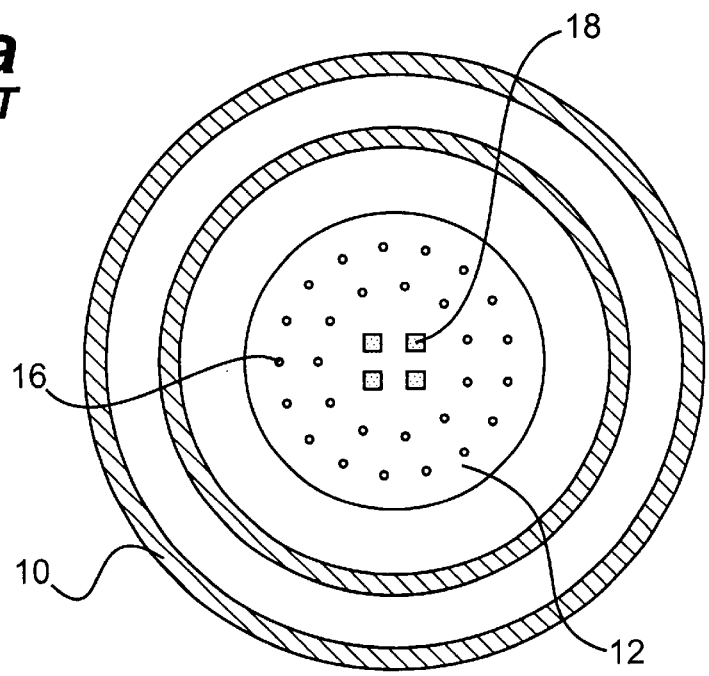
FIG. 1b illustrates the top view of a conventional electrostatic chuck system.
Figure 1C:
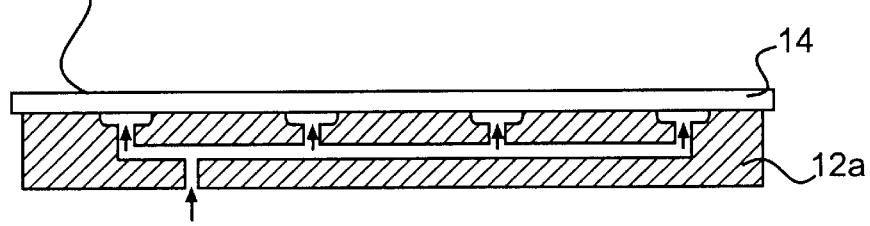
FIG. 1c illustrates the cross-sectional view of a conventional electrostatic chuck system.
Figure 2A:
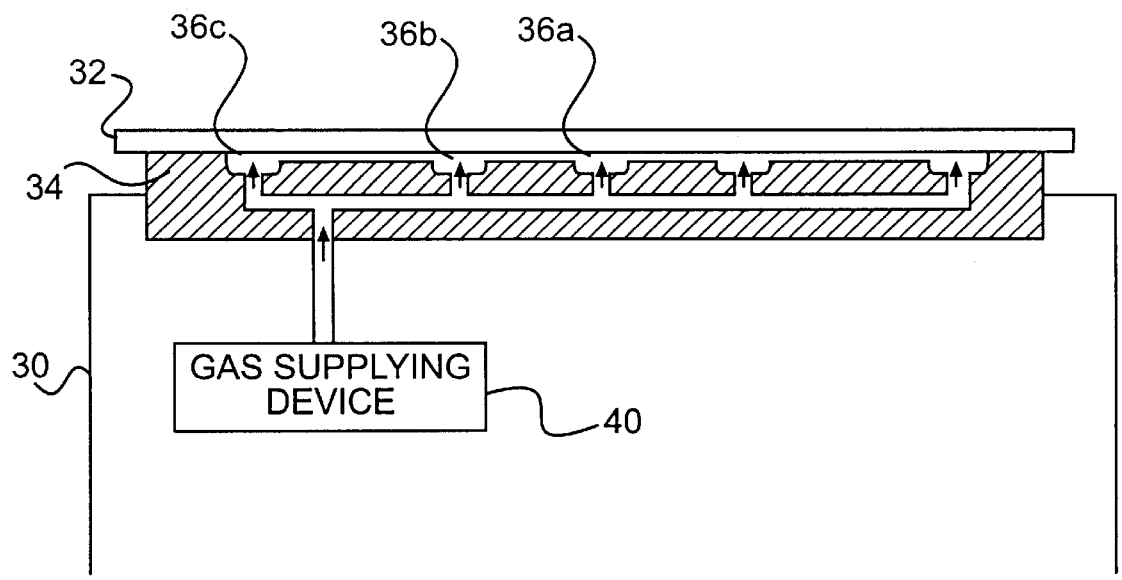
FIG. 2a illustrates a cross-sectional view of a chuck system for supporting a semiconductor wafer in accordance with the present invention.

FIG. 2a illustrates a cross-sectional view of a chuck system 30 for supporting a semiconductor wafer 32 in accordance with the present invention. The chuck system 30 can be an electrostatic chuck system or other types of chuck systems, such as the traditional mechanical chuck systems. In one embodiment of the present invention, the chuck system 30 is an electrostatic chuck system that operates in a plasma processing chamber for an etching or deposition process. The chuck system 30 includes a pedestal 34 that has an upper surface for supporting the semiconductor wafer 32.

Figure 2B:
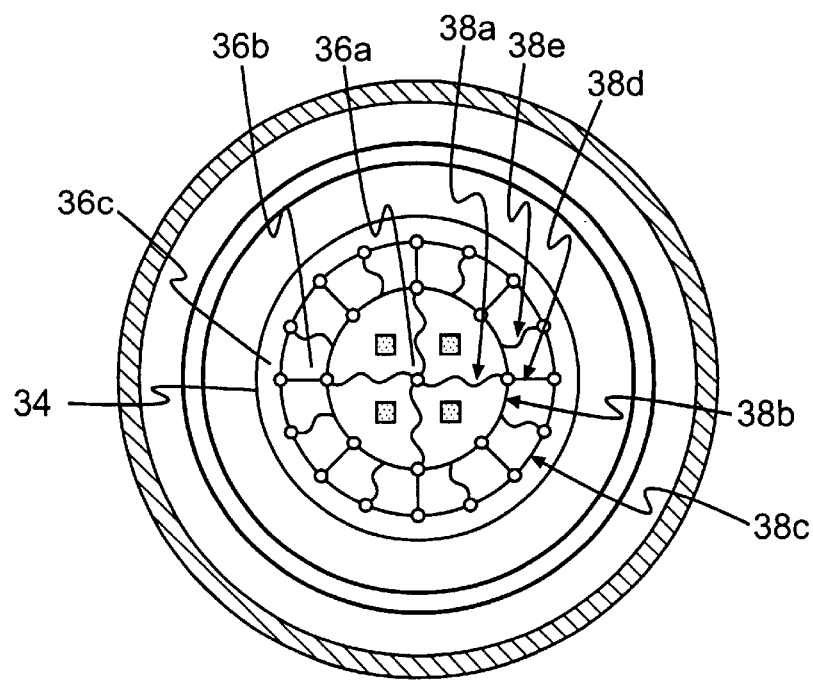
FIG. 2b illustrates a top view of the chuck system that has a number of gas holes and grooves in accordance with the present invention.

FIG. 2b illustrates a top view of the chuck system 30. Referring to FIG. 2b, the chuck system 30 includes a plurality of gas holes, e.g., 36a, 36b, and 36c, passing through the pedestal 34. The gas holes 36a, 36b, and 36c provide channels for gas to reach the backside semiconductor wafer 32 in order to serve as a thermal transfer medium. The chuck system 30 also has a plurality of grooves, e.g., 38a, 38b, 38c, 38d, and 38e, on the upper surface of the pedestal 34 and the grooves 38a, 38b, 38c, 38d, and 38e connect among the gas holes 36a, 36b, and 36c. The grooves 38a, 38b, 38c, 38d, and 38e are recessed channels formed on the upper surface of the pedestal 34 and may have a width and depth ranging from 0.1 to several millimeters. A width of about 0.5 mm is employed in a preferred embodiment.

The chuck system 30 may have a gas supplying device 40 that pumps gas to the gas holes 36a, 36b, and 36c, and therefore also to the grooves 38a, 38b, 38c, 38d, and 38e. In the application of using the chuck system 30 in a plasma processing chamber with a nearly vacuum environment, the gas pumped by the gas supplying device 40 serves as a thermal transfer medium to control the temperature of the wafer 32. In a preferred embodiment, the gas supplying device 40 pumps inert gas such as helium to the gas holes 36a, 36b, and 36c, and to grooves 38a, 38b, 38c, 38d, and 38e.

The gas holes 36a, 36b, and 36c, and grooves 38a, 38b, 38c, 38d, and 38e on the upper surface of the pedestal 34 can be arranged in different ways or patterns to meet the cooling need and the processing characteristics of a processing chamber. In one embodiment of the present invention, a first set of gas holes 36b are arranged in a circular pattern on the pedestal 34 in a first radius and a second set of gas holes 36c arranged in a circular pattern on the pedestal 34 in a second radius. The second radius is larger than the first radius as illustrated in FIG. 2b. Further, the chuck system 30 may have a center gas hole 36a and grooves 38a connecting between the center gas hole 36a and the first set of gas holes 36b. Preferably, these grooves 38a are curved grooves formed on the upper surface of the pedestal 34.

Additional grooves may be added between gas holes, between gas holes and grooves, or between grooves. As another embodiment, the grooves include first circular grooves 38b that connect between the first set of gas holes 36b. The grooves also include second circular grooves 38c that connect between the second set of gas holes 36c. The grooves may include linear grooves 38d that connect between the first set of gas holes 36b and the second set of gas holes 36c. Referring again to FIG. 2b, the grooves may also include curved grooves 38e that either connect between the first set of gas holes 36b and the second set of gas holes 36c, or connect the second set of gas holes 36c to the first circular grooves 38b connecting between the first set of gas holes 36b. The curved grooves 38a and 38e are formed with smooth curves to provide smooth gas flow or even inducing some turbulence within the grooves to enhance the gas cooling effect.

The chuck system of the present invention therefore enhances the cooling effect of a wafer during processing by providing gas holes and grooves for enhanced gas flow to cool the wafer. The uniformity in the temperature distribution on the wafer surface can be increased and the yield of wafer fabrication processes is thereby increased by maintaining uniform processing characteristics. By having effective cooling or temperature control of the chuck system of the present invention, the operating power of a processing chamber can be increased without risking negative impact resulting from inappropriate cooling. The present invention therefor reduces processing time and increases the production efficiency.

It will be apparent to those skilled in the art that various modifications and variations can be made in the disclosed system without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A chuck system, comprising:
   a pedestal having an upper surface for supporting a semiconductor wafer;
   a plurality of gas holes passing through the pedestal, the gas holes providing channels for gas to travel therethrough; and
   a plurality of grooves on the upper surface of the pedestal, the grooves connecting the gas holes, wherein at least one of the grooves connects only two adjacent gas holes.

2. The chuck system as claimed in claim 1, further comprising a gas supplying device that pumps gas to the gas holes and grooves.

3. The chuck system as claimed in claim 2, wherein the gas supplying device supplies helium to the gas holes and grooves.

4. The chuck system as claimed in claim 1, wherein the gas holes include a first set of gas holes arranged in a circular pattern on the pedestal in a first radius and a second set of gas holes arranged in a circular pattern on the pedestal in a second radius, the second radius being greater than the first radius.

5. The chuck system as claimed in claim 4, further comprising a center gas hole in the center of the pedestal and grooves connecting between the center gas hole and the first set of gas holes, the grooves being curved grooves on the upper surface of the pedestal.

6. The chuck system as claimed in claim 4, wherein the grooves comprise a first set of circular grooves connecting the first set of gas holes and a second set of circular grooves connecting the second set of gas holes.

7. The chuck system as claimed in claim 4, wherein the grooves include linear grooves connecting the first set of gas holes and the second set of gas holes.

8. The chuck system as claimed in claim 4, wherein the grooves include curved grooves connecting the first set of gas holes and the second set of gas holes.

9. The chuck system as claimed in claim 4, wherein the grooves include curved grooves connecting the second set of gas holes to first circular grooves connecting the first set of gas holes.

10. The chuck system as claimed in claim 1, further comprising a center gas hole in the center of the pedestal.

11. An electrostatic chuck system, comprising:
    a pedestal having an upper surface for supporting a semiconductor wafer;
    a plurality of gas holes passing through the pedestal, the gas holes providing channels for gas to reach the semiconductor wafer; and
    a plurality of grooves on the upper surface of the pedestal, the grooves including linear grooves and curved grooves connecting between the gas holes, wherein at least one of the grooves connects only two adjacent gas holes.

12. The chuck system as claimed in claim 11, further comprising a gas supplying device that pumps gas to the gas holes and grooves.

13. The chuck system as claimed in claim 12, wherein the gas supplying device supplies helium to the gas holes and grooves.

14. The chuck system as claimed in claim 11, wherein the gas holes include a first set of gas holes arranged in a circular pattern on the pedestal in a first radius and a second set of gas holes arranged in a circular pattern on the pedestal in a second radius, the second radius being greater than the first radius.

15. The chuck system as claimed in claim 14, further comprising a center gas hole in the center of the pedestal and grooves connecting between the center gas hole and the first set of gas holes, the grooves being curved grooves on the upper surface of the pedestal.

16. The chuck system as claimed in claim 14, wherein the grooves include first circular grooves connecting between the first set of gas holes and second circular grooves connecting between the second set of gas holes.

17. The chuck system as claimed in claim 14, wherein the grooves include linear grooves connecting between the first set of gas holes and the second set of gas holes.

18. The chuck system as claimed in claim 14, wherein the grooves include curved grooves connecting between the first set of gas holes and the second set of gas holes.

19. The chuck system as claimed in claim 14, wherein the grooves include curved grooves connecting the second set of gas holes to first circular grooves connecting between the first set of gas holes.

20. A chuck system, comprising:
    a pedestal having an upper surface for supporting a semiconductor wafer;
    a plurality of gas holes passing through the pedestal, the gas holes providing channels for gas to reach the semiconductor wafer, the gas holes including
        a center gas hole in the center of the pedestal,
        a first set of gas holes arranged in a circular pattern on the pedestal in a first radius, and
        a second set of gas holes arranged in a circular pattern on the pedestal in a second radius, the second radius being greater than the first radius; and
    a plurality of grooves on the upper surface of the pedestal, the grooves including
        center grooves connecting between the center gas hole and the first set of gas holes, the grooves being curved grooves on the upper surface of the pedestal,
        first circular grooves connecting between the first set of gas holes, second circular grooves connecting between the second set of gas holes,
        linear grooves connecting between the first set of gas holes and the second set of gas holes, and
        curved grooves connecting the second set of gas holes to the first circular grooves connecting between the first set of gas holes,
        wherein at least one of the grooves connects only two adjacent gas holes.

* * * * *